United States Patent
Huang et al.

(10) Patent No.: US 10,863,626 B1
(45) Date of Patent: Dec. 8, 2020

(54) ELECTRONIC PACKAGE CARRIER STRUCTURE THEREOF, AND METHOD FOR FABRICATING THE CARRIER STRUCTURE

(71) Applicant: Siliconware Precision Industries Co., Ltd., Taichung (TW)

(72) Inventors: Yu-Lung Huang, Taichung (TW); Chee-Key Chung, Taichung (TW); Chang-Fu Lin, Taichung (TW); Yuan-Hung Hsu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/669,872

(22) Filed: Oct. 31, 2019

(30) Foreign Application Priority Data

Sep. 2, 2019 (TW) .............................. 108131538 A

(51) Int. Cl.
*H05K 3/30* (2006.01)
*H05K 1/18* (2006.01)
*H05K 3/46* (2006.01)
*H05K 1/02* (2006.01)

(52) U.S. Cl.
CPC .......... *H05K 1/184* (2013.01); *H05K 1/0271* (2013.01); *H05K 3/303* (2013.01); *H05K 3/4697* (2013.01); *H05K 2201/10568* (2013.01)

(58) Field of Classification Search
CPC ................... H05K 1/18; H05K 1/0271; H05K 1/0201–0204; H05K 1/021; H05K 3/303
See application file for complete search history.

(56) References Cited

U.S. PATENT DOCUMENTS

| | | | | |
|---|---|---|---|---|
| 5,706,171 A | * | 1/1998 | Edwards | H01L 23/42 257/717 |
| 2008/0239685 A1 | * | 10/2008 | Kawabe | H01L 23/50 361/782 |
| 2015/0257316 A1 | * | 9/2015 | Lin | H05K 13/0486 156/150 |
| 2019/0221507 A1 | * | 7/2019 | Kimura | H01L 23/49805 |

* cited by examiner

*Primary Examiner* — Hoa C Nguyen
(74) *Attorney, Agent, or Firm* — Mintz Levin Cohn Ferris Glovsky and Popeo, P.C.; Peter F. Corless; Steven M. Jensen

(57) ABSTRACT

A carrier structure is provided. A spacer is formed in an insulation board body provided with a circuit layer, and is not electrically connected to the circuit layer. The spacer breaks the insulation board body, and a structural stress of the insulation board body will not be continuously concentrated on a hard material of the insulation board body, thereby preventing warpage from occurring to the insulation board body.

12 Claims, 11 Drawing Sheets

FIG. 2C"

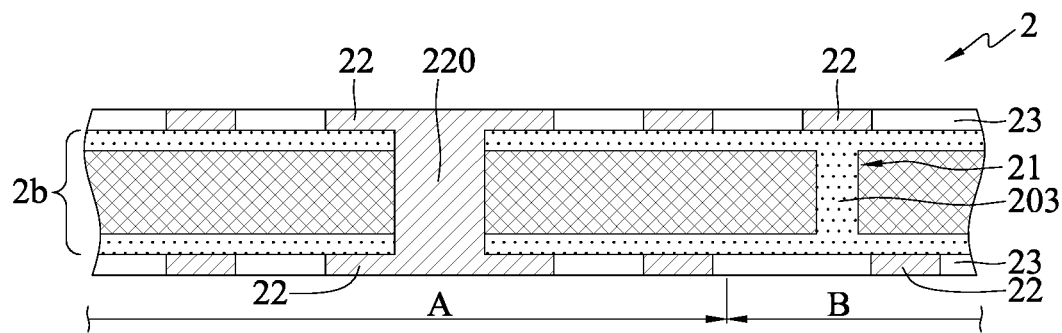
FIG. 2E
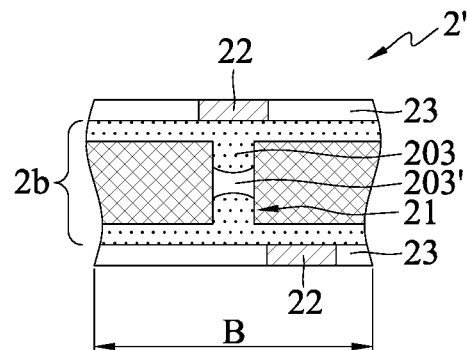
FIG. 2E'
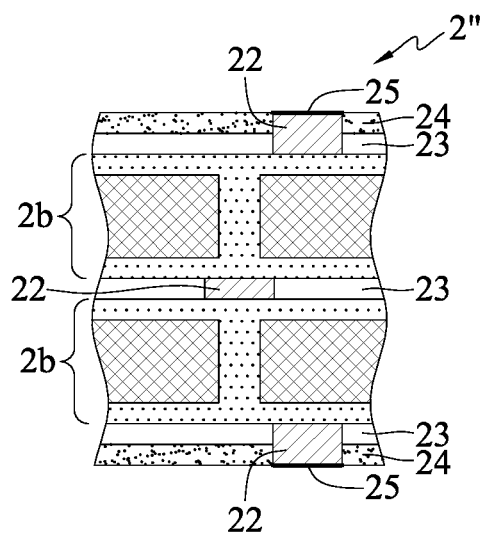
FIG. 2E"

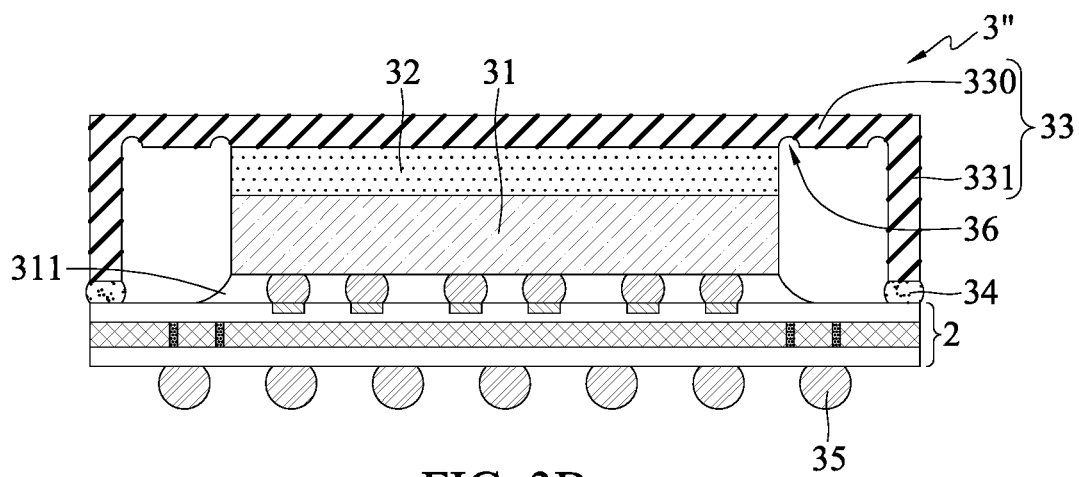
FIG. 3B
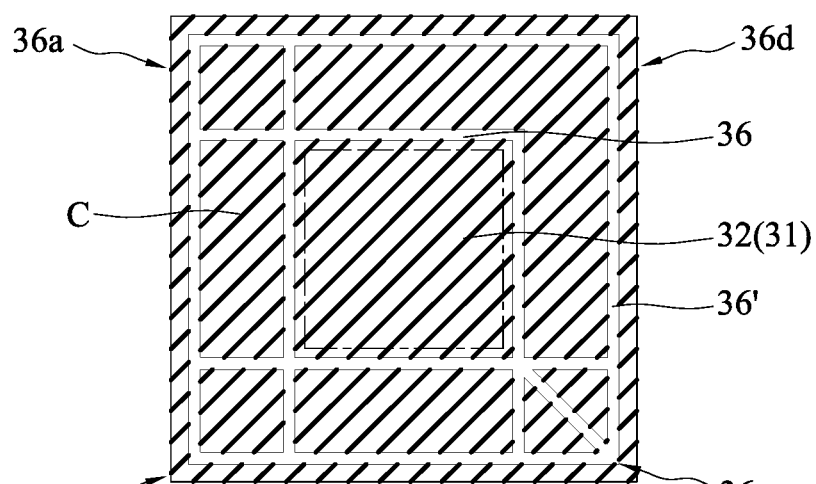
FIG. 3B'
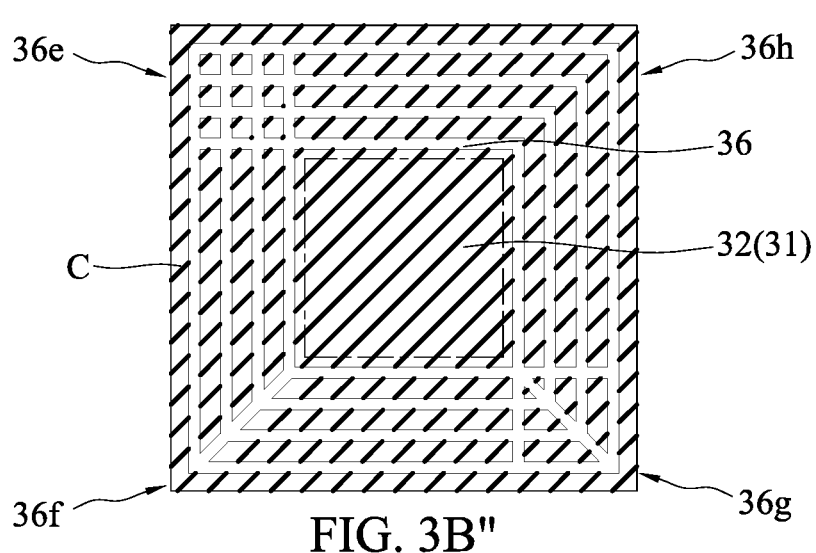
FIG. 3B"

ELECTRONIC PACKAGE CARRIER STRUCTURE THEREOF, AND METHOD FOR FABRICATING THE CARRIER STRUCTURE

CROSS-REFERENCE TO RELATED APPLICATIONS

This application claims priority to Taiwan Application Serial No. 108131538, filed on Sep. 2, 2019. The entirety of the application is hereby incorporated by reference herein and made a part of this specification.

BACKGROUND

1. Technical Field

The present disclosure relates to semiconductor packaging structures, and, more particularly, to an electronic package, a carrier structure of the electronic package, and a method for fabricating the carrier structure.

2. Description of the Prior Art

FIG. 1 shows a semiconductor package 1 according to the prior art. A semiconductor chip 11, with its active surface 11a, is disposed in a flip-chip manner on a packaging substrate 10 via conductive bumps 110 and an underfill 111. A heat sink 13 is reflowed, and bonded, with its top plate 130, to an inactive surface 11b of the semiconductor chip 11 via a thermal interface material (TIM) layer 12. Supporting legs 131 of the heat sink 13 are mounted via an adhesive layer 14 on the packaging substrate 10. Heat generated by the semiconductor chip 11 is conveyed from the inactive surface 11b, through the TIM layer 12 and the top plate 130 of the heat sink 13, to a region outside of the semiconductor package 1.

However, in the semiconductor package 1 according to the prior art, the packaging substrate 10 is likely to be deformed during a thermal cycle of a packaging process due to the phenomenon of thermal expansion and contraction and its material characteristics, and suffers warpage. Therefore, the conductive bumps 110 cannot be bonded to the packaging substrate 10 effectively and precisely.

As technology evolves, electronic products are developed to have various types of components, and a multichip module (MCM) and a multichip package (MCP) come to the market, which integrate and package a plurality of semiconductor chips into a single semiconductor chip. The semiconductor chip thus fabricated has a great number of I/O, increases the operation capability of a processor significantly, reduces the delay time of signal transmission, and can be applied to a high-level product, which has a high circuit density, high transmission speed, a large number of layers stacked, and a large size. However, such a packaging structure is complex, and has to be realized in a small volume. Therefore, the packaging structure is fragile, and is likely to malfunction if it suffers warpage or other types of deformation. As more multiple chips are gathered on a single substrate, the packaging structure is becoming larger and larger, which worsens the warpage-induced delamination and ball and chip cracking problems.

Therefore, how to overcome the problems of the prior art is becoming an urgent issue in the art.

SUMMARY

In view of the problems of the prior art, the present disclosure provides a carrier structure, comprising: an insulation board body; a circuit layer formed on the insulation board body; and a first spacer disposed in the insulation board body and free from being electrically connected to the circuit layer.

The present disclosure also provides a method for fabricating a carrier structure, comprising: providing a substrate; forming a cavity in the substrate; forming a metal layer on the substrate to cover the cavity acting as a spacer; and forming a circuit layer via the metal layer, wherein the spacer is free from being electrically connected to the circuit layer.

In an embodiment, the substrate comprises a core layer having an insulation core portion, and the spacer penetrates through the insulation core portion. In another embodiment, the core layer further comprises at least one insulation portion formed on the insulation core portion. In yet another embodiment, the insulation portion is pressurized and heated to be formed in the spacer.

In an embodiment, the substrate is defined with a chip mounting region and a surrounding region surrounding the chip mounting region, and the spacer is disposed within the surrounding region. In another embodiment, the spacer is disposed on a profile edge and/or in a profile corner of the surrounding region. In yet another embodiment, the surrounding region is defined with an underfill boundary line dividing the surrounding region into a first region neighboring the chip mounting region and a second region surrounding the first region. In still another embodiment, the spacer is disposed within the first region and/or the second region of the surrounding region.

In an embodiment, the spacer is a slot, a hole, or a combination thereof.

In an embodiment, the spacer has a profile in a shape of a straight line, a curve line, waves, sawteeth, or a combination thereof.

The present disclosure further provides an electronic package, comprising: the aforementioned carrier structure; an electronic component disposed on the carrier structure and electrically connected to the circuit layer; and a heat sink disposed on the carrier structure, wherein the heat sink has a second spacer.

In an embodiment, the heat sink comprises a heat dissipating body bonded to the electronic component. In another embodiment, the second spacer is disposed on a side of the heat dissipating body bonded to the electronic component. In yet another embodiment, the second spacer is disposed outside a region where the heat dissipating body is bonded to the electronic component.

In an embodiment, the second spacer is a slot, a hole, or a combination thereof.

In an embodiment, the second spacer has a profile in a shape of a straight line, a curve line, waves, sawteeth, or a combination thereof.

In the electronic package, the carrier structure thereof, and the method for fabricating the carrier structure according to the present disclosure, the spacer damages or breaks the insulation board body or the substrate, and a structural stress of the insulation board body or the substrate will not be continuously concentrated on a hard material of the insulation board body or the substrate. Compared with the prior art, the carrier structure according to the present disclosure can avoid or reduce the warpage problem.

The spacer, which is filled with soft resin (i.e., the insulation body), can absorb the stress of the hard material of the insulation board body or the substrate and the thermal deformation caused in a subsequent high-temperature process.

BRIEF DESCRIPTION OF THE DRAWINGS

FIGS. 2A to 2E are cross-sectional views illustrating a method for fabricating a carrier structure according to the present disclosure.

FIG. 2A' is a top view of FIG. 2A.

FIG. 2B' is a top view of FIG. 2B.

FIGS. 2C' and 2C" are schematic diagrams of different embodiments from FIG. 2C.

FIGS. 2E' and 2E" are schematic diagrams of different embodiments from FIG. 2E.

FIG. 3B is a cross-sectional view of an electronic package according to the present disclosure.

FIGS. 3B' and 3B" are partial top views of different embodiments from FIG. 3B.

DETAILED DESCRIPTION

The following illustrative embodiments are provided to illustrate the present disclosure, these and other advantages and effects can be apparently understood by those in the art after reading the disclosure of this specification. The present disclosure can also be performed or applied by other different embodiments. The details of the specification may be on the basis of different points and applications, and numerous modifications and variations can be devised without departing from the spirit of the present disclosure.

The terminology used herein is for the purpose of describing particular devices and methods and is not intended to be limiting of this disclosure. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of stated features, integers, steps, operations, elements, and/or components, but do not preclude the presence or addition of one or more other features, integers, steps, operations, elements, components, and/or groups thereof.

FIGS. 2A to 2E are cross-sectional views illustrating a method for fabricating a carrier structure 2 according to the present disclosure.

Figure 1:
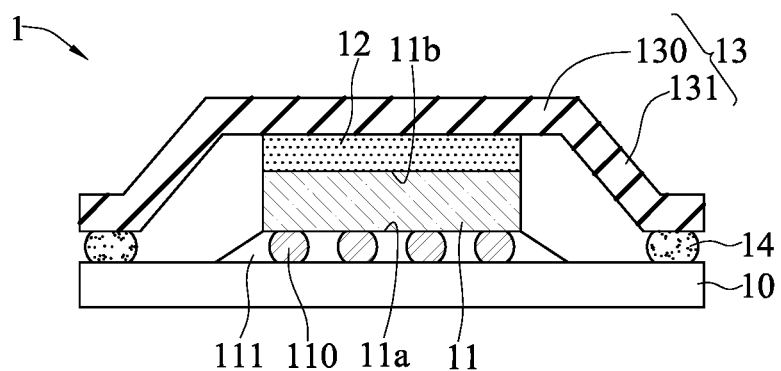
FIG. 1 is a cross-sectional view of a semiconductor package according to the prior art.
Figure 2A:
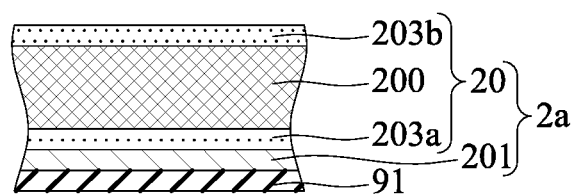
Figure 2A:
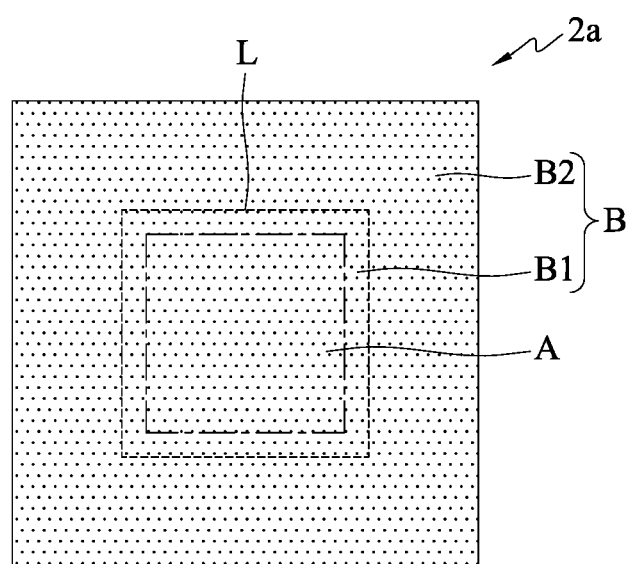

As shown in FIGS. 2A and 2A', a substrate 2a is provided, which is defined with a chip mounting region A and a surrounding region B surrounding the chip mounting region A.

In an embodiment, the substrate 2a is disposed on a first carrier 91, and comprises a first metal layer 201 and a core layer 20 stacked on the first carrier 91 sequentially. The core layer 20 comprises a first insulation portion 203a, an insulation core portion 200, and a second insulation portion 203b stacked on the first metal layer 201 sequentially. In an embodiment, the first carrier 91 is a metal (e.g., stainless steel) compress plate, the first metal layer 201 is a copper foil, the first and second insulation portions 203a and 203b are resin, such as epoxy resin, and the insulation core portion 200 comprises fiber glass and organic resin, such as bismaleimide triazine (BT), flame retardant 4 (FR4), flame retardant 5 (FR5), etc.

When the substrate 2a is fabricated, the first metal layer 201 can be formed on the first carrier 91, then an adhesion plate that is fabricated completely acts as the core layer 20, and the first insulation portion 203a of the core layer 20 is adhered onto the first metal layer 201.

The surrounding region B is defined with an underfill boundary line L (in the shape of a ring, for example) that divides the surrounding region B into a first region B1 neighboring the chip mounting region A and an outermost second region B2, wherein the second region B2 surrounds the first region B1.

Figure 2B:
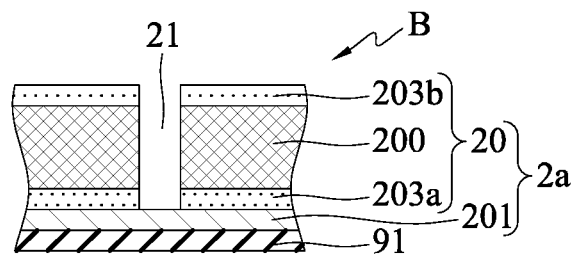
Figure 2B:
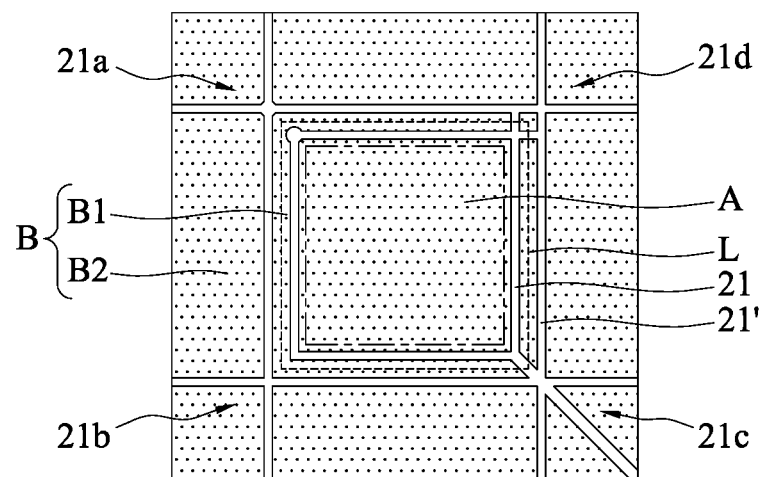

As shown in FIG. 2B, a cavity is formed within the surrounding region B of the substrate 2a and acts as a first spacer 21, from which the first metal layer 201 is exposed.

In an embodiment, the first spacer 21 penetrates the core layer 20 (or the insulation core portion 200), without penetrating the first metal layer 201, leaving the first metal layer 201 intact. In an embodiment, the first spacer 21 is formed by laser in a slot digging process, and the laser intensity used is in accordance with the wavelength range that does not damage, or severely damage the copper foil. The first metal layer 201 acts as a blocking layer in the slot digging process.

The first spacer 21 is disposed within the surrounding region B. In an embodiment, the first spacer 21 is disposed on a profile edge (e.g., the first region B1) and/or in a profile corner of the surrounding region B, as the cavities 21a, 21b, 21c and 21d shown in FIG. 2B'. In another embodiment, the first spacer 21 is disposed within the first region B1 and/or the second region B2 of the surrounding region B.

In an embodiment, the first spacer 21 is formed within a region between the profile edge of the chip mounting region A and the profile edge of the underfill boundary line L. In another embodiment, the first spacer 21' is formed neighboring the profile edge of the underfill boundary line L. In yet another embodiment, cavities 21a, 21b, 21c and 21d are formed at four corners of the substrate 2a to act as the first spacer 21. The cavity 21c has a diagonal line aspect shown in FIG. 2B'. In still another embodiment, the aspect disclosed in each of the corners can be formed on a single core layer 20. In further embodiment, the four corners have the same or at least two aspects of the cavities.

Figure 2C:
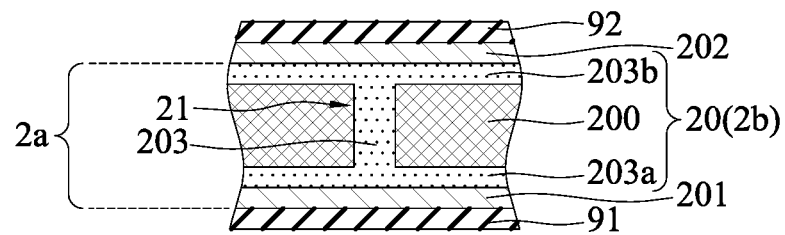
Figure 2C:
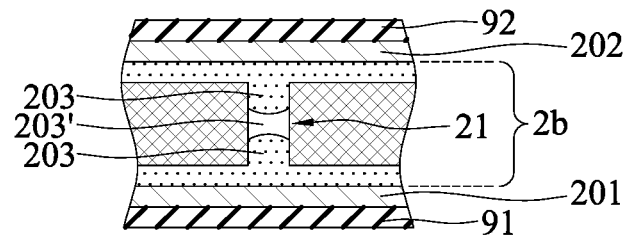

As shown in FIG. 2C, a second metal layer 202 is formed on the substrate 2a and covers the first spacer 21.

In an embodiment, the second carrier 92 compresses the second metal layer 202 onto the second insulation portion 203b of the core layer 20 of the substrate 2a. In an embodiment, the second carrier 92 is a metal (e.g., stainless steel) compress plate, the second metal layer 202 is a copper foil to form a copper foil substrate, and the first insulation portion 203a, the insulation core portion 200 and the second insulation portion 203b act as the insulation board body 2b in the copper foil substrate.

When the second metal layer 202 is compressed, a portion of the first insulation portion 203a and/or the second insulation portion 203b can be filled into the first spacer 21, to form an insulator 203 in the first spacer 21. As shown in FIG. 2C, the insulator 203 fills the first spacer 21 completely. As shown in FIG. 2C', the insulator 203 fills the first spacer 21 partially, and a hollow portion 203' is formed in the first spacer 21. In an embodiment, the first insulation portion 203a and/or the second insulation portion 203b is not filled into the first spacer 21, as shown in FIG. 2C", and the first spacer 21 acts as a hollow portion 203".

The first and second carriers 91 and 92 act as compress plates, to allow the resin of the first insulation portion 203a and/or the second insulation portion 203b, when pressured and heated, to be melt and filled in the first spacer 21.

Figure 2D:
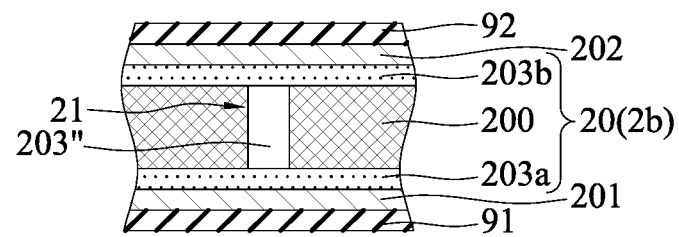
Figure 2D:
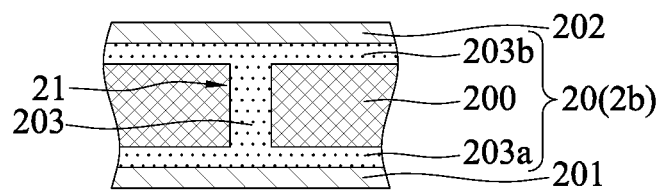

As shown in FIG. 2D, subsequent to the process of FIG. 2C, the first carrier 91 and the second carrier 92 are removed, to expose the first metal layer 201 and the second metal layer 202.

As shown in FIG. 2E, a patterning process is performed, such that the first metal layer 201 and the second metal layer 202 are not electrically connected to the circuit layer 22 of the first spacer 21 (or the insulator 203), and at least one conductive via 220 is formed and electrically connected to the circuit layer 22, to obtain the carrier structure 2 as needed.

In an embodiment, the conductive via 220 is formed within the chip mounting region A. In another embodiment, the conductive via 220 is formed within the surrounding region B.

In an embodiment, the carrier structure 2 is provided with at least one dielectric layer 23 on the insulation board body 2b (or the core layer 20), and the circuit layer 22 is exposed from the dielectric layer 23.

If the processes of FIGS. 2C' and 2C" are followed, the first spacer 21 of the carrier structure 2' within the surrounding region B will have the hollow portion 203', as shown in FIG. 2E'.

Another carrier structure 2" can be formed by stacking a core layer, forming a spacer, compressing a metal layer and patterning a circuit layer sequentially, as shown in FIG. 2E". A surface treatment layer 25 (made of a nickel gold material, for example) is formed on the outermost side of the circuit layer 22. An insulation protection layer 24, such as a solder mask, is formed on the outermost side of the dielectric layer 23, and the outermost side of the circuit layer 22 is exposed from the insulation protection layer 24. Stacking a core layer 20, a spacer, a metal layer, such as a copper foil and patterning can be performed repetitively. While multiple insulation board bodies 2b are stacked on one another, the spacers of the insulation board bodies 2b may have different positions or sizes based on the different moire conditions.

According to the method for fabricating the carrier structure 2, 2', 2" according to the present disclosure, the first spacer 21 damages (or breaks) the insulation core portion 200 of the insulation board body 2b, and the structural stress will not be continuously concentrated on the insulation core portion 200, which is made of a hard material (e.g., glass fiber). Compared with the prior art, the carrier structure 2, 2', 2" according to the present disclosure avoids or reduces the warpage problem according to the stress breaking principle. The stress breaking points (a plurality of the first spacers 21) act as deformation adjusting points of the carrier structure 2, 2', 2", to compensate the warpage direction.

The first spacer 21, which has a soft resin (the insulator 203) filled therein, can absorb the stress of the hard material (e.g., glass fiber) and the thermal deformation caused by the subsequent high-temperature process.

The soft resin (the insulator 203) can act as a spacing component that breaks the insulation core portion 200, and two neighboring segments, obtained by the breakage of the insulation core portion 200, will not prop against each other due to the thermal deformation. Therefore, the stress breaking effect is improved and continues.

Figure 2F:
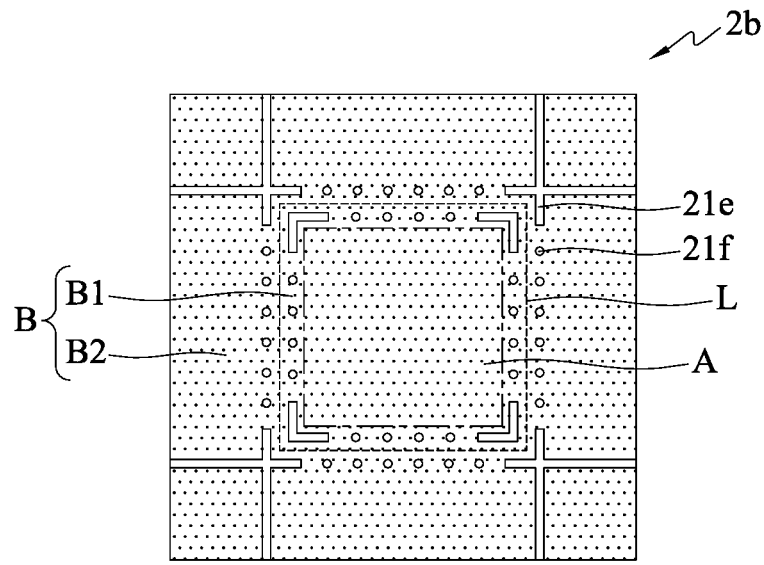
FIGS. 2F and 2F' are top views of the insulation board body of FIG. 2E.
Figure 2F:
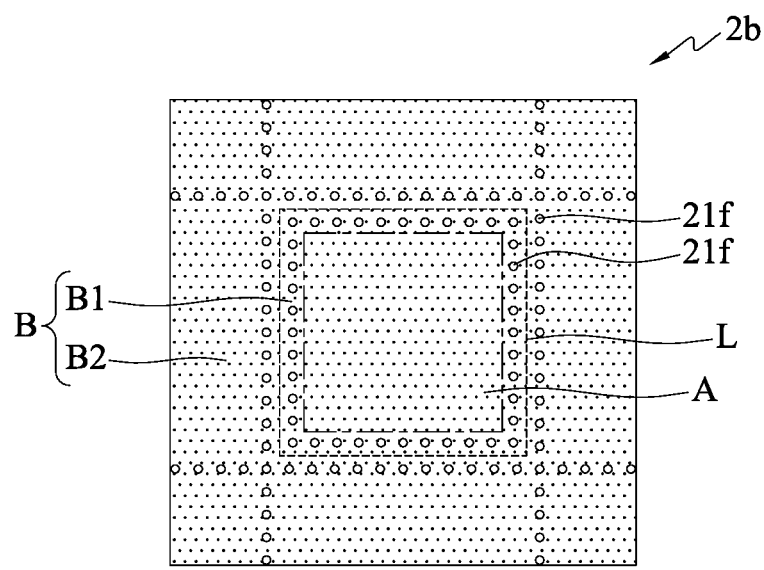

In the carrier structure 2, 2', 2" according to the present disclosure, the best cavity design is an all slot design, and the second best design is to form the first spacer 21 along the region between the profile edge of the chip mounting region A and the profile edge of the underfill boundary line L, and along the profile edge neighboring the underfill boundary line L, as shown in FIG. 2F, where the cavity design employs slot-shaped cavity 21e at the edge-corner and hole-shape cavity 21f at the edge line segment, the first spacer 21 is formed at the four corners, and the cavity design employs a slot shape; alternatively, as shown in FIG. 2F', the all hole cavity 21f design is employed.

Figure 3A:
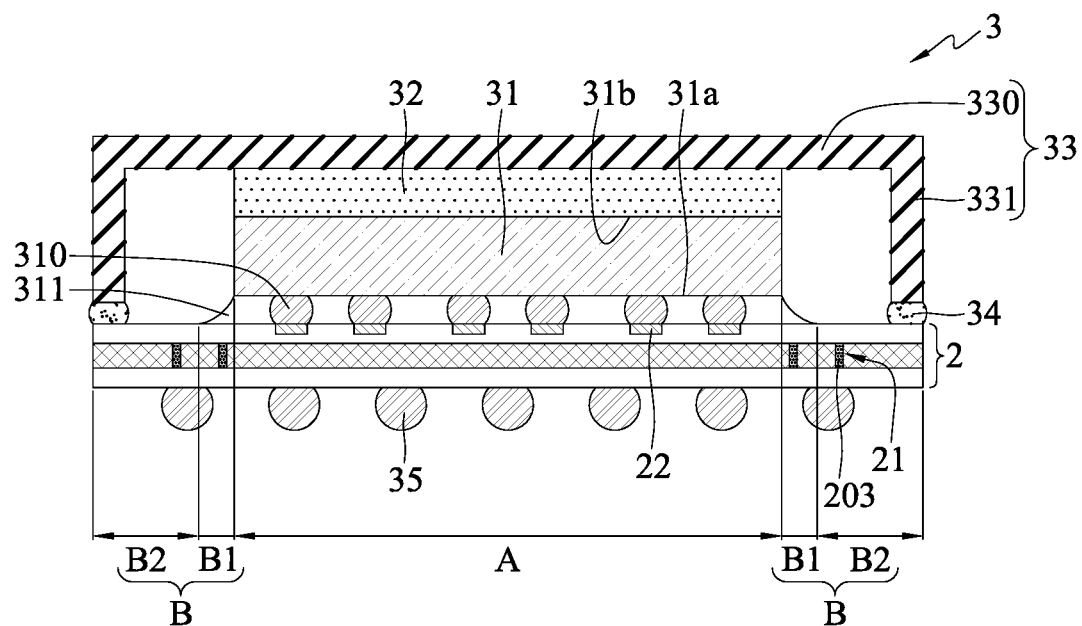
FIGS. 3A and 3A' are cross-sectional views illustrating subsequent processes of different embodiments from FIG. 2E.
Figure 3A:
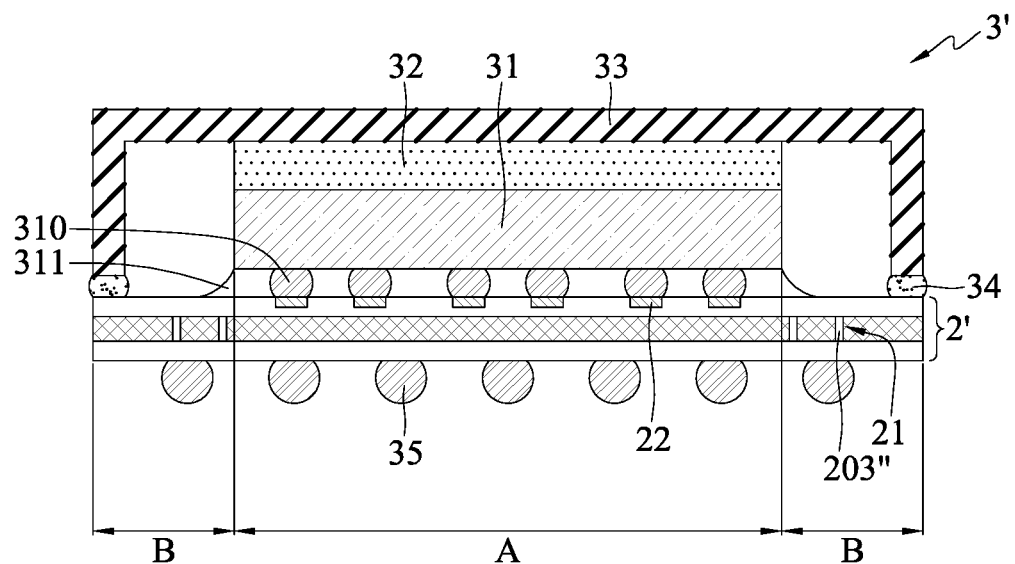

FIGS. 3A and 3A' are cross-sectional views of different aspects of electronic package 3, 3' that employs the carrier structure 2, 2', 2" according to the present disclosure.

As shown in FIGS. 3A and 3A', at least one electronic component 31 and one heat sink 33 are disposed on the carrier structure 2, 2'.

The electronic component 31 is disposed within the chip mounting region A of the carrier structure 2, 2'. The electronic component 31 is an active element, a passive element, a packaging element, or a combination thereof.

In an embodiment, the active element is a semiconductor chip, the passive element is a resistor, a capacitor and an inductor, the packaging element comprises a substrate, a chip disposed on the substrate, and an encapsulation layer encapsulating the chip. In another embodiment, the electronic component 31 is a semiconductor chip, and has an active surface 31a and an inactive surface 31b opposing the active surface 31a. In yet another embodiment, the electronic component 31 is bonded and electrically connected via a plurality of conductive bumps 310 to the circuit layer 22 of the carrier structure 2, 2' in a flip-chip manner, and an underfill 311 encapsulates the conductive bumps 310. In still another embodiment, the electronic component 31 is electrically connected to the circuit layer 22 in a wire bonding manner or other manners.

The underfill 311 is disposed within the underfill boundary line L, without exceeding to a region outside of the underfill boundary line L.

The heat sink 33 is bonded via a bonding layer 32 onto the inactive surface 31b of the electronic component 31.

In an embodiment, the heat sink 33 has a heat dissipating body 330 and a plurality of supporting legs 331 disposed on a bottom side of the heat dissipating body 330. In an embodiment, the heat dissipating body 330 is a heat dissipating plate and in contact with the bonding layer 32 with its bottom side. The supporting legs 331 are bonded via a resin 34 onto the surrounding region B of the carrier structure 2, 2', and disposed on the upper surface of the carrier structure 2, 2' correspondingly.

The bonding layer 32 is a thermal interface material (TIM) or a general heat dissipating resin.

A second spacer 36 can be disposed on the heat sink 33 on demands, as the electronic package 3" shown in FIG. 3B. In an embodiment, the heat dissipating body 330 has a cavity on a side toward the bonding layer 32 (or the electronic component 31) to act as the second spacer 36, and the supporting legs 331 and the second spacer 36 are disposed on the same side of the heat dissipating body 33.

As shown in FIGS. 3B' and 3B", the second spacer 36 is disposed in a region outside of a layout region (a dashed-line region shown in FIGS. 3B' and 3B") of the bonding layer 32 (or the electronic component 31), and disposed outside a region where the heat dissipating body 330 is bonded to the bonding layer 32 (or the electronic component 31). Therefore, a cavity can be formed along a profile edge where the heat dissipating body 330 is bonded to the electronic component 31 (e.g., a region C outside of the profile edge of the bonding layer 32), to act as the second spacer 36. In an embodiment, the second spacer 36' is formed in an intersection corner of the heat dissipating body 330 and the supporting legs 331, as shown in FIG. 3B'. In another embodiment, the second spacers 36a, 36b, 36c, 36d, 36e, 36f, 36g and 36h are formed in four corners of the heat dissipating body 330. In still another embodiment, the aspect disclosed in each of the corners can be formed on a single heat dissipating body 330. In further embodiment, the four corners have the same or at least two aspects of the cavities.

Figure 5A:
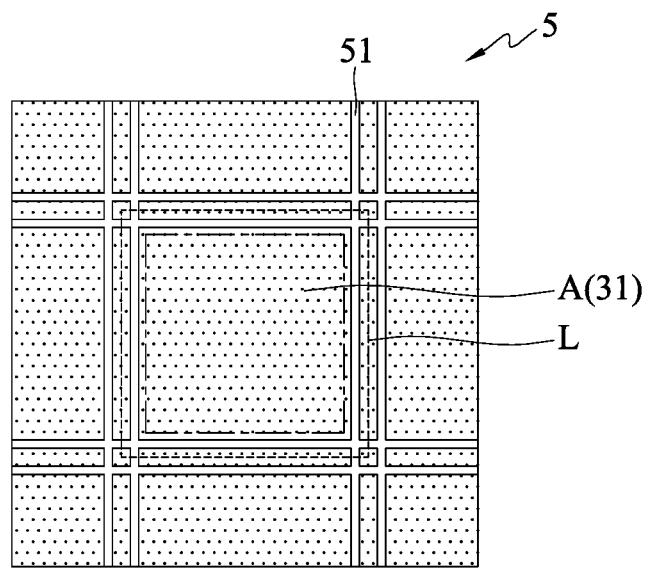
FIGS. 5A and 5B are partial top views showing the difference of a second embodiment of FIG. 3B.
Figure 5B:
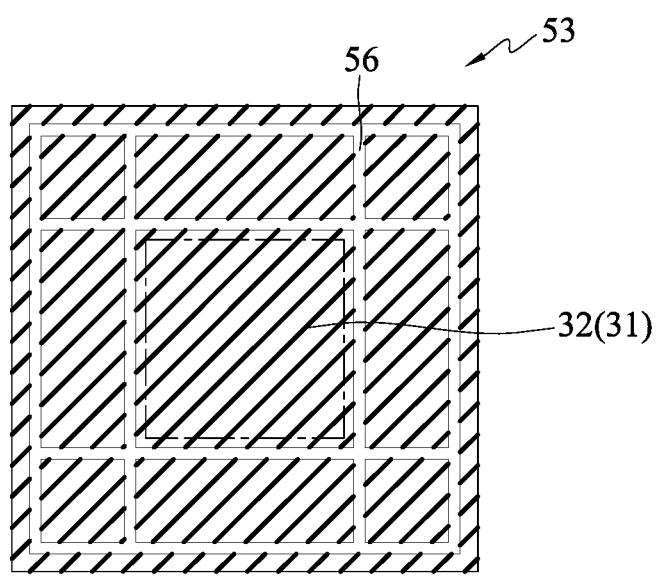
Figure 6A:
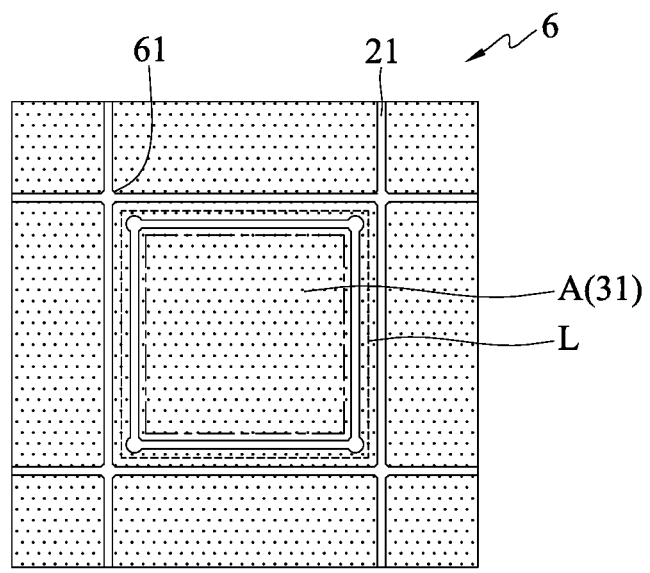
FIGS. 6A and 6B are partial top views showing the difference of a third embodiment of FIG. 3B.
Figure 6B:
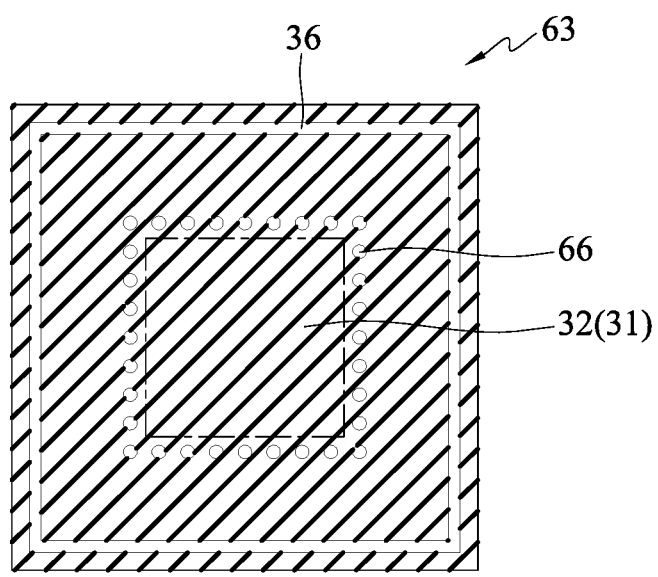

The cavity (i.e., the first spacer 21 and the second spacer 36) is a slot or a hole (e.g., the cavity 61 of the carrier structure 6 shown in FIG. 6A, and the cavity 66 of the heat sink 63 shown in FIG. 6B), and the cavity (the spacer) is in the shape of a straight line (e.g., the cavity 51 of the carrier structure 5 shown in FIG. 5A, and the cavity 56 of the heat sink 53 shown in FIG. 5B), a curve line (e.g., the cavity 41b of the carrier structure 4 shown in FIG. 4A), waves (e.g., the cavity 41a of the carrier structure 4 shown in FIG. 4A and the cavity 46 of the heat sink 43 shown in FIG. 4B), sawteeth, or a combination thereof, such as a ring. In an embodiment, the cavity (the spacer) is a slot formed by a continuous line segment, a plurality of slots are arranged to be a needed pattern. In an embodiment, the cavity can have any pattern on demands.

Figure 4A:
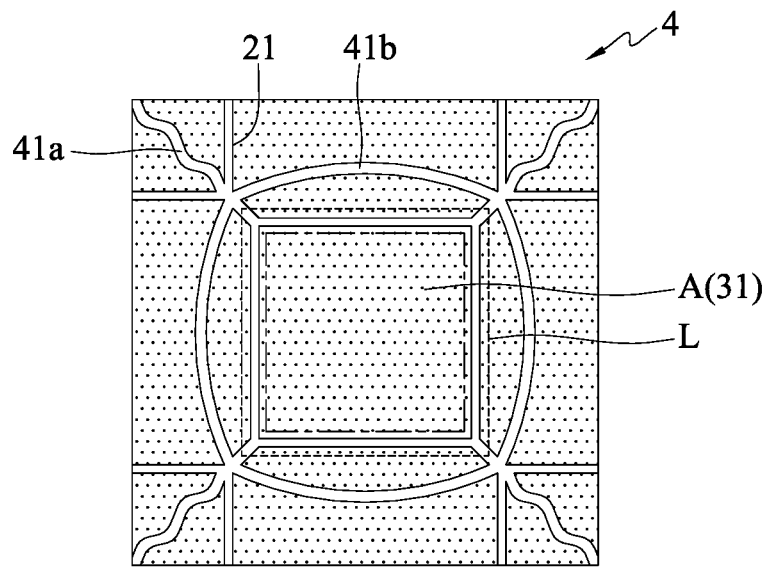
FIGS. 4A and 4B are partial top views showing the difference of a first embodiment of FIG. 3B.
Figure 4B:
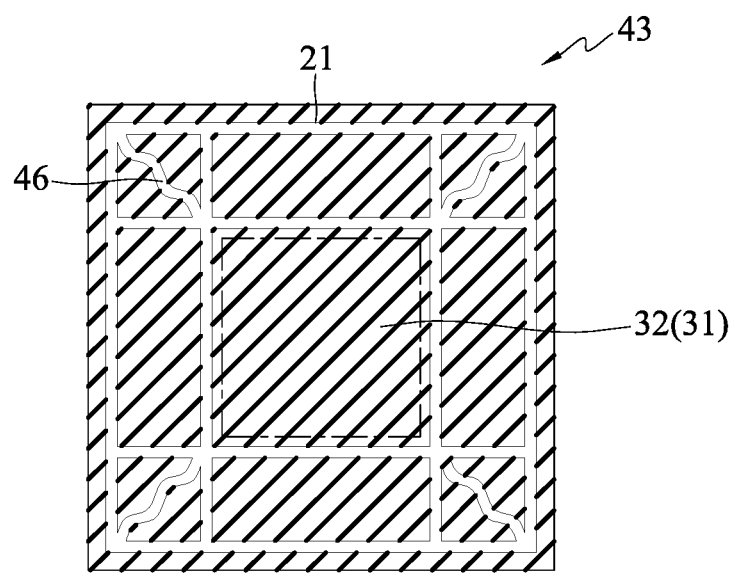

The substrate 4 of FIG. 4A and the heat sink 43 of FIG. 4B have a first best structural combination. The substrate 5 of FIG. 5A and the heat sink 53 of FIG. 5B have a second best structural combination. The substrate 6 of FIG. 6A and the heat sink 63 of FIG. 6B have a third best structural combination.

In the electronic package 3, 3', 3" according to the present disclosure, the first spacer 21 and the second spacer 36 avoid the warpage. In terms of avoiding the warpage, the first best structural combination is better than the second best structural combination, and the second best structural combination is better than the third best structural combination.

The present disclosure further provides an electronic package 3, 3', 3", which comprises: a carrier structure 2, 2', 2", an electronic component 31 disposed on the carrier structure 2, 2', 2" and electrically connected to the circuit layer 22, and a heat sink 33 disposed on the carrier structure 2, 2', 2". The heat sink 33 has a second spacer 36. The carrier structure 2, 2', 2" comprises an insulation board body 2b, at least one circuit layer 22 disposed on the insulation board body 2b, and a first spacer 21 disposed in the insulation board body 2b, wherein the first spacer 21 is not electrically connected to the circuit layer 22.

In an embodiment, the insulation board body 2b comprises a core layer 20 having an insulation core portion 200, and the first spacer 21 penetrates the insulation core portion 200. In another embodiment, the core layer 20 further comprises at least one first insulation portion 203a and at least one second insulation portion 203b formed on the insulation core portion 200. In yet another embodiment, the first insulation portion 203a and the second insulation portion 203b are further formed in the first spacer 21.

In an embodiment, the insulation board body 2b is defined with a chip mounting region A and a surrounding region B surrounding the chip mounting region A, and the first spacer 21 is within the surrounding region B. In another embodiment, the first spacer 21 is on an profile edge and/or in a profile corner of the surrounding region B. In yet another embodiment, the surrounding region B is defined with an underfill boundary line L that divides the surrounding region B into a first region B1 neighboring the chip mounting region A and a second region B2 surrounding the first region B1. In still another embodiment, the first spacer 21 is within the first region B1 and/or the second region B2 of the surrounding region B.

In an embodiment, the first spacer 21 is a slot, a hole, or a combination thereof. In another embodiment, the first spacer 21 has a profile in a shape of a straight line, a curve line, waves, sawteeth, or a combination thereof.

In an embodiment, the heat sink 33 comprises a heat dissipating body 330 bonded to the electronic component 31 and at least one supporting leg 331 disposed on the heat dissipating body 330, the heat dissipating body 330 is disposed via the supporting leg 331 on the carrier structure 2, 2', 2", and the second spacer 36 is disposed on a side of the heat dissipating body 330 bonded to the electronic component 31.

In an embodiment, the second spacer 36 is disposed outside a region where the heat dissipating body 330 is bonded to the electronic component 31.

In an embodiment, the second spacer 36 is a slot, a hole, or a combination thereof. In another embodiment, the second spacer 36 has a profile in a shape of a straight line, a curve line, waves, sawteeth, or a combination thereof.

In the electronic package, the carrier structure of the electronic package, and the method for fabricating the carrier structure according to the present disclosure, the spacer of the insulation board body damages (or breaks) the internal structure of the insulation board body, and the structural stress will not be continuously concentrated in the insulation board body. Therefore, the carrier structure according to the present disclosure can avoid or reduce the warpage problem.

The spacer of the insulation board body, which is filled with the insulator, can absorb the stress of the hard material of the insulation board body and the thermal deformation caused in a subsequent high-temperature process.

The foregoing descriptions of the detailed embodiments are illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. A carrier structure, comprising:
an insulation board body comprises a core layer having an insulation core portion and at least one insulation portion formed on the insulation core portion;
a circuit layer formed on the insulation board body; and
a first spacer disposed in the insulation board body and free from being electrically connected to the circuit layer, wherein the first spacer penetrates through the insulation core portion and breaks the insulation core portion such that the insulation core portion is formed with at least two segments separated from each other, and wherein the insulation portion is further formed in the first spacer.

2. The carrier structure of claim 1, wherein the insulation board body is defined with a chip mounting region and a surrounding region surrounding the chip mounting region, and the first spacer is disposed within the surrounding region.

3. The carrier structure of claim 2, wherein the first spacer is on a profile edge and/or in a profile corner of the surrounding region.

4. The carrier structure of claim 2, wherein the surrounding region is defined with an underfill boundary line dividing the surrounding region into a first region neighboring the chip mounting region and a second region surrounding the first region.

5. The carrier structure of claim 4, wherein the first spacer is disposed within the first region and/or the second region of the surrounding region.

6. The carrier structure of claim 1, wherein the first spacer is a slot, a hole, or a combination thereof.

7. The carrier structure of claim 1, wherein the first spacer has a profile in a shape of a straight line, a curve line, waves, sawteeth, or a combination thereof.

8. An electronic package, comprising:
   the carrier structure of claim 1;
   an electronic component disposed on the carrier structure and electrically connected to the circuit layer; and
   a heat sink disposed on the carrier structure and having a second spacer.

9. The electronic package of claim 8, wherein the heat sink comprises a heat dissipating body bonded to the electronic component, and the second spacer is disposed on a side of the heat dissipating body bonded to the electronic component.

10. The electronic package of claim 9, wherein the second spacer is disposed outside a region where the heat dissipating body is bonded to the electronic component.

11. The electronic package of claim 8, wherein the second spacer is a slot, a hole, or a combination thereof.

12. The electronic package of claim 8, wherein the second spacer has a profile in a shape of a straight line, a curve line, waves, sawteeth, or a combination thereof.

\* \* \* \* \*